(12) United States Patent
Tsai

(10) Patent No.: US 8,861,149 B2
(45) Date of Patent: Oct. 14, 2014

(54) ESD PROTECTION DEVICES AND METHODS FOR FORMING ESD PROTECTION DEVICES

(75) Inventor: Ming-Hsien Tsai, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 265 days.

(21) Appl. No.: 12/986,450

(22) Filed: Jan. 7, 2011

(65) Prior Publication Data

US 2012/0176709 A1 Jul. 12, 2012

(51) Int. Cl.
*H02H 9/04* (2006.01)
*H03F 1/52* (2006.01)
*H01L 27/02* (2006.01)
*H03F 3/193* (2006.01)
*H03F 1/22* (2006.01)

(52) U.S. Cl.
CPC .............. *H01L 27/0255* (2013.01); *H03F 1/52* (2013.01); *H02H 9/046* (2013.01); *H01L 27/0288* (2013.01); *H03F 3/193* (2013.01); *H03F 2200/441* (2013.01); *H03F 1/223* (2013.01); *H03F 2200/294* (2013.01); *H03F 2200/444* (2013.01)
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 5,629,544 A * | 5/1997 | Voldman et al. ............... | 257/355 |
| 6,137,143 A | 10/2000 | Dabral et al. | |
| 6,847,511 B2 * | 1/2005 | Ohnakado et al. .............. | 361/56 |
| 6,898,060 B2 | 5/2005 | Juliano et al. | |
| 6,911,739 B1 * | 6/2005 | Jin et al. ......................... | 257/784 |
| 7,582,916 B2 * | 9/2009 | Ker et al. ....................... | 257/107 |
| 8,213,142 B2 | 7/2012 | Worley | |
| 2005/0059358 A1 * | 3/2005 | Block et al. ..................... | 455/78 |
| 2005/0063129 A1 * | 3/2005 | Kato .............................. | 361/212 |
| 2006/0050453 A1 | 3/2006 | Duvvury et al. | |
| 2006/0125014 A1 | 6/2006 | Chong et al. | |
| 2008/0291591 A1 * | 11/2008 | Huang et al. .................... | 361/56 |
| 2010/0073834 A1 * | 3/2010 | Troemel et al. ................. | 361/56 |
| 2010/0277840 A1 | 11/2010 | Huang et al. | |
| 2011/0181990 A1 * | 7/2011 | Huang et al. .................... | 361/56 |

FOREIGN PATENT DOCUMENTS

EP 2148434 1/2010

OTHER PUBLICATIONS

Bo-Jr Huang et al, "Design and Analysis for a 60-GHz Low-Noise-Amplifier With RF ESD Protection", 0018-9480-$25.00, 2009 IEEE, IEEE Transactions on Microwave Theory and Techniques, vol. 57, No. 2, Feb. 2009, pp. 298-305.*

(Continued)

*Primary Examiner* — Jared Fureman
*Assistant Examiner* — Kevin J Comber
(74) *Attorney, Agent, or Firm* — Haynes and Boone, LLP

(57) ABSTRACT

The present disclosure provides a circuit that has an electrostatic discharge (ESD) protection device and a protected circuit in communication with the ESD protection device. The ESD protection device has a first inductor between a signal input terminal and a complimentary power line. The first inductor has a length less than ¼ of a normal operating wavelength of the protected circuit. The ESD protection device also has a first capacitor between the signal input terminal and the protected circuit.

18 Claims, 18 Drawing Sheets

1400

(56) References Cited

OTHER PUBLICATIONS

Jean-Robert Manouvrier et al., "Characterization of the Transient Behavior of Gated/STI Diodes and their Associated BJT in the CDM Time Domain", EOS/ESD Symposium 07-165, pp. 3A.2-1 through 3A.2-10.

Ming-Dou Ker et al., "On-Chip ESD Protection Strategies for RF Circuits in CMOS Technology", 1-42440161-5/06/$20.00, 2006 IEEE, 4 pages.

Ming-Hsien Tsai et al., "A 6.5kV ESD-Protected Low Noise Amplifier in 65-nm CMOS", 978-1-4244-6057-1/10/$26.00, 2010 IEEE, pp. 485-488.

Bo-Jr Huang et al., "Design and Analysis for a 60-GHz Low-Noise Amplifier With RF ESD Protection", 0018-9480/$25.00, 2009 IEEE, IEEE Transactions on Microwave Theory and Techniques, vol. 57, No. 2, Feb. 2009, pp. 298-305.

USPTO Office Action, U.S. Appl. No. 12/986,303, Oct. 11, 2012, 7 pgs.

USPTO Interview Summary, U.S. Appl. No. 12/986,303, Dec. 5, 2012, 4 pgs.

USPTO Office Action, U.S. Appl. No. 12/985,948, Jan. 29, 2013, 17 pgs.

USPTO, Office Action, U.S. Appl. No. 12/985,948, Oct. 9, 2012, 22 pgs.

USPTO, Final Office Action, U.S. Appl. No. 12/985,948, Jul. 23, 2013, 19 pgs.

\* cited by examiner

ESD PROTECTION DEVICES AND METHODS FOR FORMING ESD PROTECTION DEVICES

CROSS-REFERENCE

The present disclosure is related to the following commonly assigned U.S. patent applications, their entire disclosures which are incorporated herein by reference: U.S. patent application Ser. No. 12/985,948 filed Jan. 6, 2011, entitled, "ESD Protection Devices and Methods For Forming ESD Protection Devices" and U.S. patent application Ser. No. 12/986,303 filed Jan. 7, 2011, entitled, "ESD Protection Devices and Methods For Forming ESD Protection Devices".

TECHNICAL FIELD

The present disclosure relates to methods of fabricating electronic devices, and more particularly, to electrostatic discharge (ESD) protection devices and methods for forming ESD protection devices.

BACKGROUND

The semiconductor integrated circuit (IC) industry has experienced rapid growth. Technological advances in IC materials and design have produced generations of ICs where each generation has smaller and more complex circuits than the previous generation. These circuits may be sensitive to electrostatic discharge (ESD) currents. Thus, ESD protection devices are utilized to prevent and reduce damages to an IC caused by ESD currents. Traditionally, some ESD protection devices have parasitic capacitance that is large enough to noticeably degrade Radio Frequency (RF) performance in the circuit being protected.

Therefore, while existing ESD protection devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
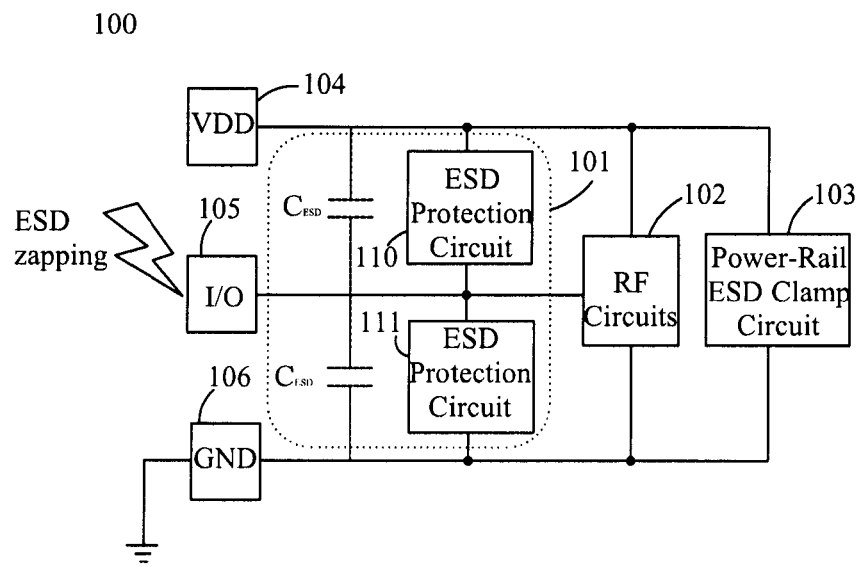
FIG. 1 is a block diagram illustration of an exemplary device, adapted according to one embodiment.

The present disclosure provides many embodiments. One embodiment of the present disclosure involves a circuit that has an electrostatic discharge (ESD) protection device and a protected circuit in communication with the ESD protection device. The protected circuit has a normal operating wavelength. The ESD protection device has a first inductor between a signal input terminal and a complimentary power line. The first inductor has a length less than ¼ of the normal operating wavelength. The ESD protection device also has a first capacitor between the signal input terminal and the protected circuit. The first inductor and the first capacitor provide matching impedance for the protected circuit.

Another embodiment of the present disclosure involves a circuit that has an electrostatic discharge (ESD) protection device positioned between a protected circuit and a signal input terminal. The signal input terminal receives a signal with a wavelength. The ESD protection device includes a first inductor having a length less than ¼ of the wavelength. The first inductor provides an ESD current path from the signal input terminal to the complimentary power line. The ESD protection device also has a first capacitor between the signal input terminal and the protected circuit. The ESD protection circuit is part of an impedance matching network for the protected circuit.

Still another embodiment of the present disclosure involves a method of fabricating a device. The method includes fabricating a protected device between a power line and a complimentary power line and fabricating an electrostatic discharge (ESD) protection device between a signal input terminal and the protected device. Fabricating the ESD protection device includes disposing a first inductor between the signal input terminal and the complimentary power line and disposing a first capacitor between the signal input terminal and the protected device. The first inductor has a length less than ¼ of a normal operating wavelength of protected device.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As technology progresses, semiconductor devices are generally being scaled down. As semiconductor devices get smaller, gate oxide breakdown voltages may become lower due to thinner gate oxide layers and ESD protection becomes more important. However, at high frequencies, some ESD protection devices may provide excessive parasitic capacitance and interfere with impedance matching networks. Various embodiments of this disclosure provide better performance, as explained in more detail below.

FIG. 1 is a block diagram illustration of an exemplary device 100, adapted according to one embodiment. Device 100 provides an illustration of a generalized configuration of various embodiments disclosed herein below. For instance, device 100 is a circuit that includes ESD protection device 101 positioned between Vdd 104 and ground (e.g., Vss) 106. ESD protection device 101 works in conjunction with clamp 103 to protect Radio Frequency (RF) circuit 102 from damaging effects of ESD at I/O terminal 105. In one example scenario, ESD protection device 101 limits the magnitude of an ESD pulse somewhat while directing the current from the ESD pulse to clamp 103, where clamp 103 quickly reduces the voltage of the ESD pulse to an acceptable range.

Figure 2:
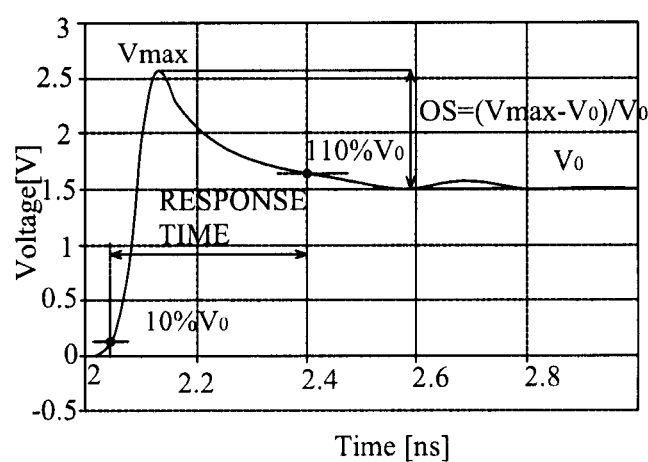
FIG. 2 shows response time (partly dependent upon clamping speed) and overshoot (OS) in an exemplary scenario.

ESD protection device 101 includes some amount of parasitic capacitance, shown in FIG. 1 as $C_{esd}$. The effect of $C_{esd}$ on a given device depends on the particular characteristics of a given device, such characteristics including, for example, operating frequency and input impedance. Various embodiments described herein provide for techniques to minimize $C_{esd}$ and/or to utilize $C_{esd}$ in impedance matching. Various embodiments may also decrease overshoot voltage for a given ESD event, thereby allowing faster and more effective clamping of the ESD event. FIG. 2 shows response time (partly dependent upon clamping speed) and overshoot (OS) in an exemplary scenario. The particular values shown in FIG. 2 are for conceptual illustration only and may or may not directly apply to any of the various embodiments shown herein.

Returning to FIG. 1, ESD protection device 101 is shown having two components 110, 111 for ease of illustration, and it is understood that ESD protection device 101 may be implemented with one or more circuit components. Furthermore, device 100 is shown as an RF circuit, though the scope of embodiments is not limited to any particular frequency range or application. For instance, some embodiments may be applied to devices that operate in the millimeter wave range or other frequency range. Various embodiments can be implemented in configurations similar to that shown in FIG. 1. For example, one or both of components 110, 111 can use protection devices as discussed below in FIGS. 3A-6.

Figure 3A:
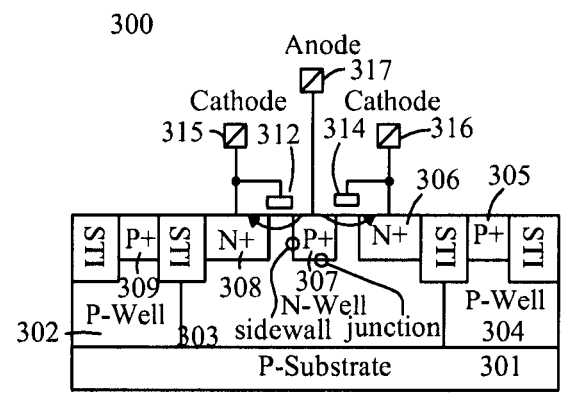
FIG. 3A is a cross-sectional illustration of exemplary device 300, adapted according to one embodiment.
Figure 3B:
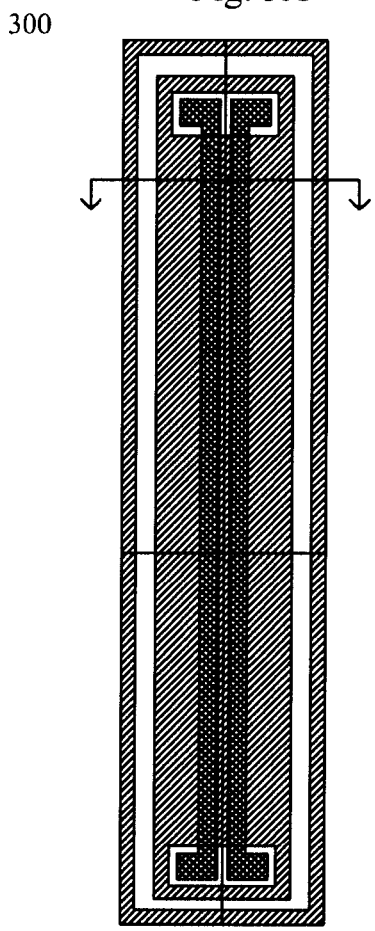
FIG. 3B is a top-down view of device 300 with a marker indicating the cut for the cross-section of FIG. 3A.

FIG. 3A is a cross-sectional illustration of exemplary device 300, adapted according to one embodiment. FIG. 3B is a top-down view of device 300 with a marker indicating the cut for the cross-section of FIG. 3A. Device 300 is strip-type, P-type poly-bounded diode. Device 300 is built on P-substrate 301 with various doped regions 302-309 thereon. Device 300 also includes polysilicon (poly) layers 312, 314 and input/output terminals 315-317. In use, anode 317 is an RF input, and cathodes 315, 316 are in communication with Vdd.

Figure 4A:
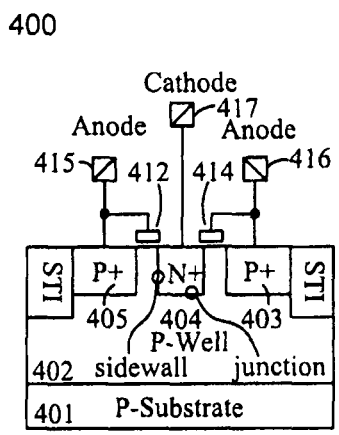
FIG. 4A is a cross-sectional illustration of an exemplary strip-type, N-type poly-bounded diode, adapted according to one embodiment.
Figure 4B:
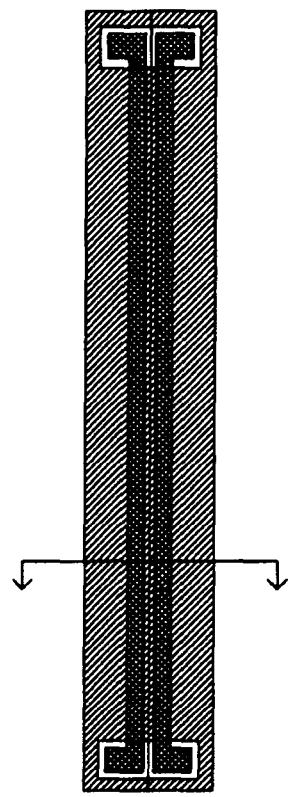
FIG. 4B is a top-down view of the diode of FIG. 4A.

FIG. 4A is a cross-sectional illustration of exemplary strip-type, N-type poly-bounded diode 400, adapted according to one embodiment. FIG. 4B is a top-down view of diode 400. Diode 400 is built on P-type substrate 401 with doped regions 402-405 thereon. Diode 400 includes poly layers 412, 414 and input/output terminals 415-417. Cathode 417 can be used as an RF input, and anodes 415, 416 can be in communication with Vss or other ground.

Some devices using poly-bounded diodes (also referred to as "gated diodes") experience advantages over similar devices that use Shallow Trench Isolator (STI)-bounded diodes. For instance, in some ESD protection applications, poly-bounded diodes provide a lower overshoot voltage and a faster rise time than similar devices with STI-bounded diodes.

Figure 5:
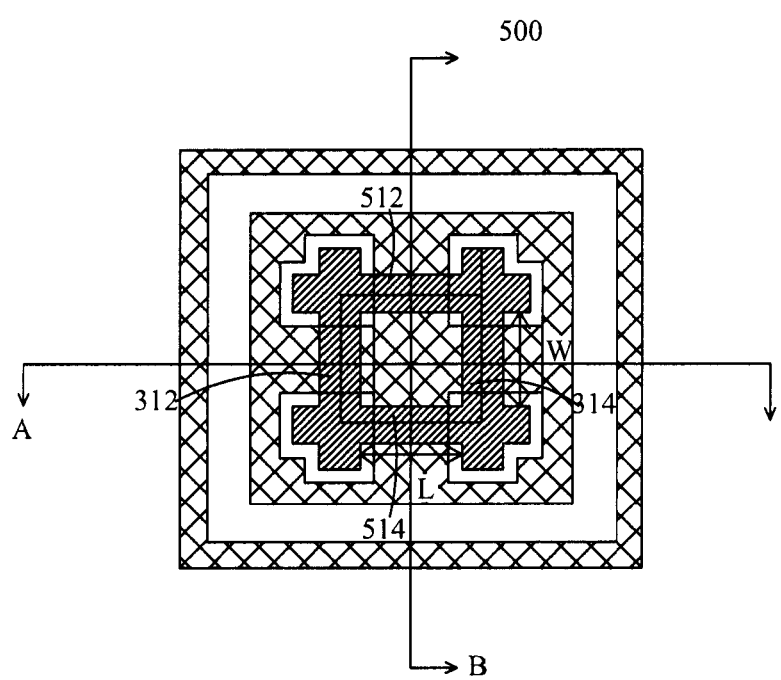
FIG. 5 is a top-down illustration of an exemplary polygon-shaped poly-bounded diode.

FIGS. 3 and 4 illustrate exemplary strip-type poly-bounded diodes, which can be incorporated into ESD protection devices. Various embodiments include polygon-shaped, rather than strip-type, diodes. FIG. 5 is a top-down illustration of exemplary polygon-shaped poly-bounded diode 500. Diode 500 is a P-type diode, and its cross-sectional view is the same as that shown in FIG. 3A when cut along line A or B. For reference, poly structures 312 and 314 are shown. Perpendicular poly sections 512, 514 are shown as well. While diode 300 (FIG. 3) is configured so that the various layers are laid out linearly along the longest dimension of FIG. 3B, by contrast, the doped layers and poly structures of diode 500 are arranged in a polygonal shape. Specifically, in diode 500, the doped layers and poly structures are laid out in a rectangle denoted by length and width dimensions L and W, respectively.

A poly-bounded diode with a polygonal layout structure, such as that shown in FIG. 5, can reduce the overall device size for the same EDS level and also reduce parasitic capacitance, as compared to the strip-type diodes of FIGS. 3 and 4. Equation 1 gives a formula for parasitic capacitance per ESD level, as it is affected by L and W.

$$\frac{Capacitance}{ESDLevel} = \frac{C_j(WL) + C_{jsw}(2W+2L)}{2W+2L} = \frac{C_j}{2}\frac{WL}{W+L} + C_{jsw} \quad (1)$$

Where $C_j$=junction capacitance
$C_{jsw}$=junction/sidewall capacitance
In Equation 1, $C_j$ is the capacitance between the doped region down to the well junction, and $C_{jsw}$ is the capacitance between the region sidewalls and the well junction. Well junctions and sidewalls are labeled in FIGS. 3A and 4A. The specific dimensional relationship where W=L provides the optimum capacitance/ESD level ratio for a rectangular device, though a given device may use a relationship other than W=L if desired.

Figure 6:
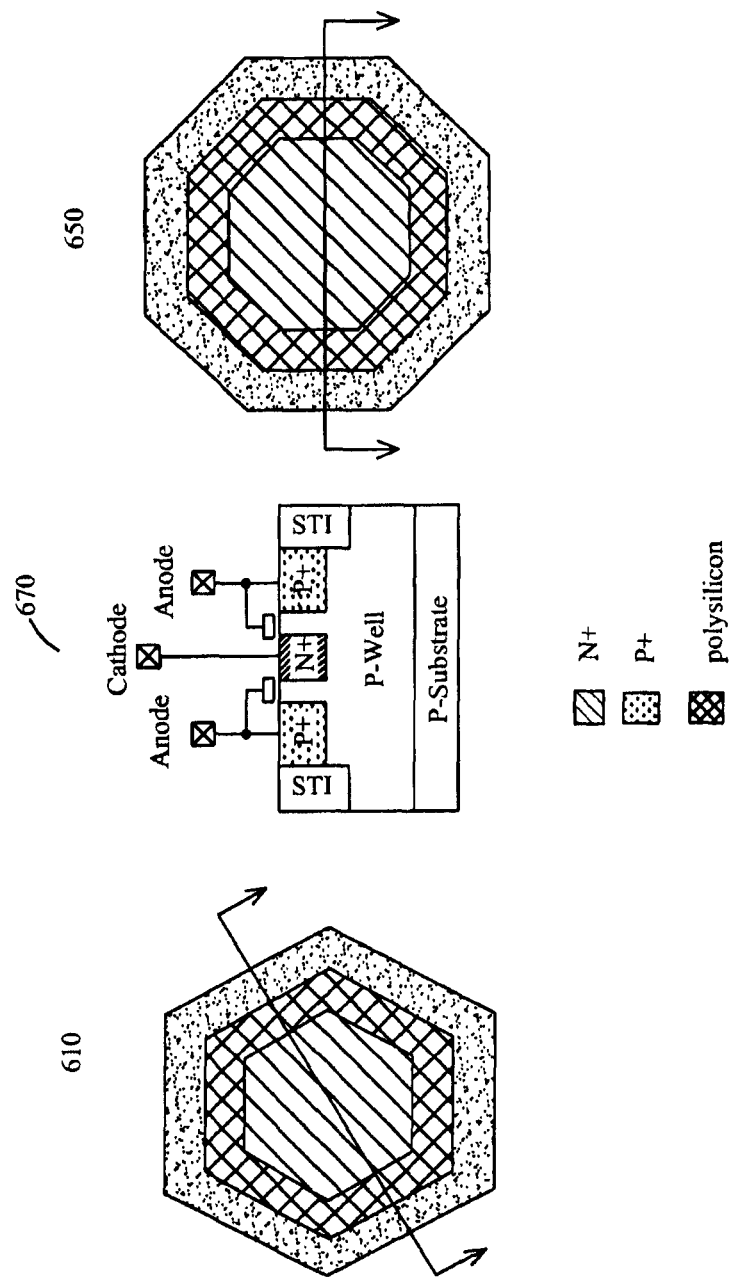
FIG. 6 is an illustration of exemplary embodiments including a hexagonal poly-bounded diode and an octagonal poly-bounded diode.

The exemplary diode shown in FIG. 5 conforms to a rectangular shape, but the scope of embodiments is not so limited. In fact, the scope of embodiments includes diodes that have layers arranged according to any arbitrary polygonal shape. FIG. 6 is an illustration of exemplary embodiments including hexagonal poly-bounded diode 610 and octagonal poly-bounded diode 650. Diodes 610 and 650 are both N-type diodes having cross-section 670. It is understood that P-type diodes according to various embodiments may be made as well.

Figure 7:
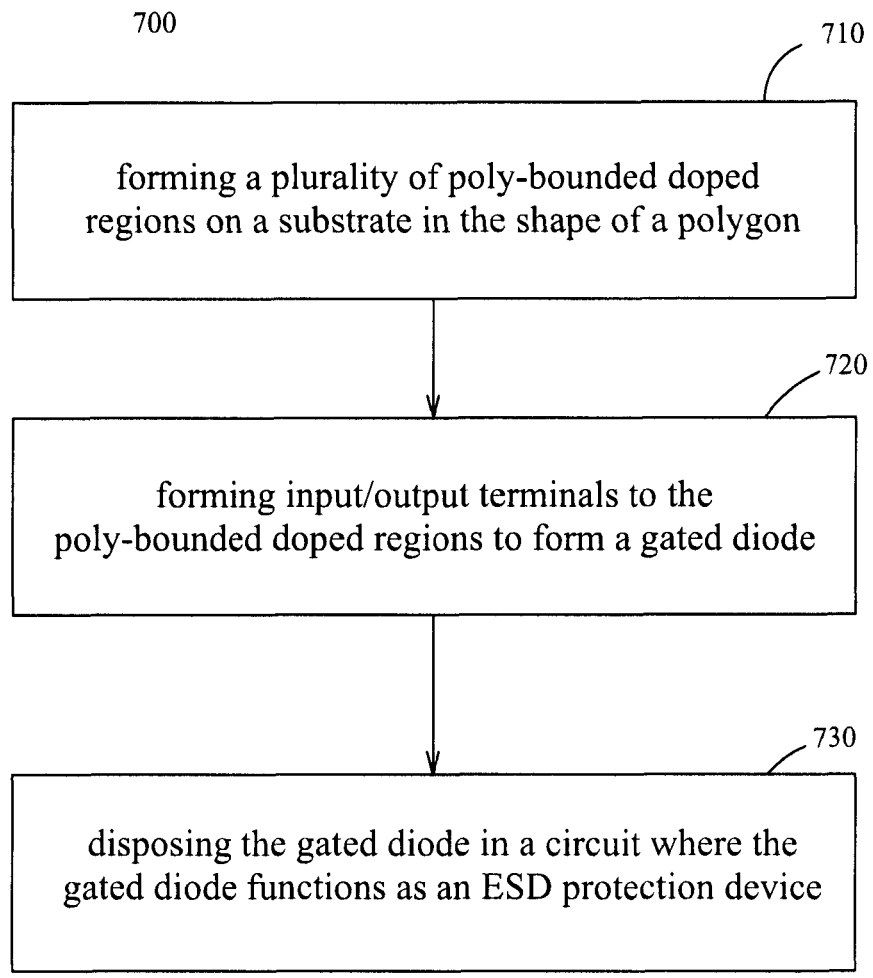
FIG. 7 is a flowchart of an exemplary method for fabricating a device, adapted according to one embodiment.

FIG. 7 is a flowchart of exemplary method 700 for fabricating a device, adapted according to one embodiment. The method 700 begins with block 710 in which a plurality of poly-bounded doped regions are formed on a substrate in the shape of a polygon. The doped regions and the polysilicon structures can be formed in any suitable manner now known or later developed, including by conventional deposition, etching, and implantation methods. By contrast to the diode 400, which as linearly-shaped poly layers, the devices of this example have a poly layer that is shaped as a closed polygon when viewed from the top down, such as is depicted in FIGS. 5 and 6.

The method 700 continues with block 720 in which input/output terminals to the poly-bounded doped regions are formed to create a gated diode. The input/output terminals can include power terminals, signal inputs, and the like. In one example, the terminals communicate with an RF pad on a circuit board for receiving and/or transmitting RF signals.

The method 700 continues at block 730, which includes disposing the gated diode in a circuit where the gated diode functions as an ESD protection device. In one example, the circuit further includes RF circuitry (e.g., a digital signal processor, low noise amplifier, or the like) and a clamping device. The gated diode is placed between the power and ground of the circuit and in parallel with the clamping device and the RF circuitry. Some embodiments include using two or more gated diodes that may be arranged, e.g., as shown by devices 110, 111 of FIG. 1. During an ESD event, the gated diode and the clamping circuit protect the RF circuitry from the harmful effects of the ESD event.

Figure 8:
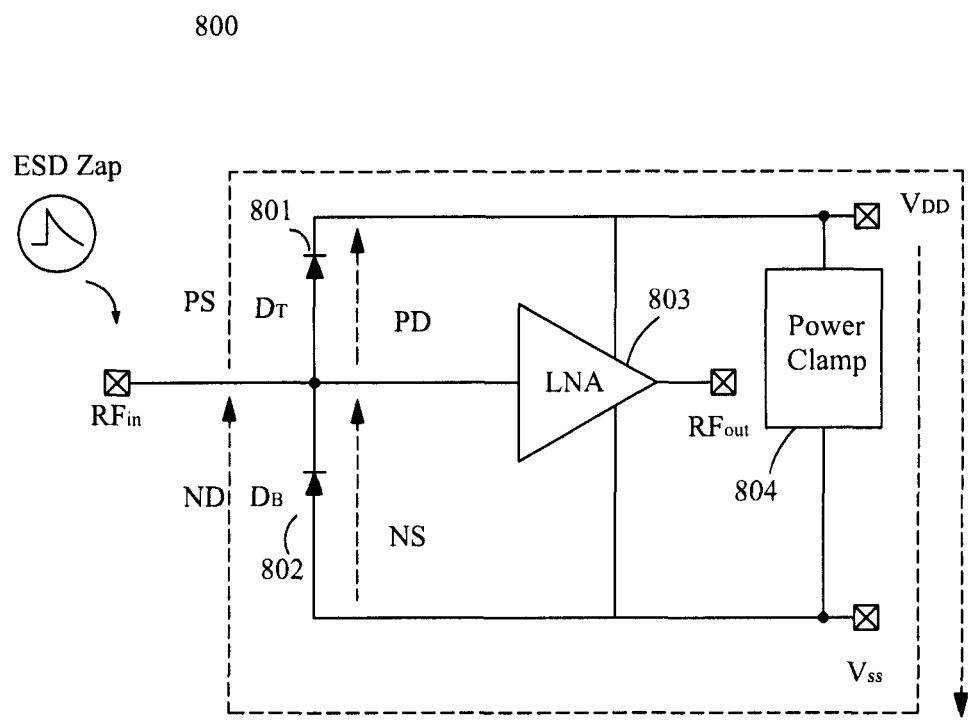
FIG. 8 shows one example circuit in which polygonal gated diodes can be used.

FIG. 8 shows one example circuit 800 in which polygonal gated diodes can be used. Diodes 801, 802 are arranged with between Vdd and Vss, and one or both of diodes 801, 802 are configured as polygonal gated diodes. Circuit 800 further includes RF circuitry (in this case, low noise amplifier 803) and power clamp 804. FIG. 8 illustrates ESD current pulse paths created by diodes 801, 802. PS is a positive ESD pulse, Vss grounded. ND is a negative ESD pulse, Vdd grounded.

Returning to FIG. 7, method 700 can be used to fabricate diodes and devices that use diodes, such as those given in examples above. Method 700 is shown as a series of discrete actions, and it is understood that various methods within the scope of embodiments may differ. For instance, other methods may add, omit, rearrange, or modify some actions.

Various embodiments provide one or more advantages over other designs. For instance, as mentioned above, poly-bounded diodes generally have lower overshoot voltages than do other kinds of diodes, such as STI-bounded diodes. Thus, in some designs, poly-bounded diodes adapted to the examples above and used as ESD protection devices may provide reduced overshoot and, consequently, facilitate faster clamping. Additionally, some designs using polygonal, rather than strip-type, diodes may provide for lower parasitic capacitance and smaller device size for the same ESD protection level. For any of the embodiments disclosed herein, polygonal poly-bounded diodes can be used, as appropriate, in place of other kinds of diodes.

In some embodiments, the power clamp 804 (FIG. 8) is designed to provide a low-impedance path between the power rails during an ESD event and is, therefore, designed to be relatively large. Such design may include a network of transistors, resistors, and a large bypass capacitor (not shown). However, a large power clamp may in some instances lead to increased leakage current and chip area cost. The embodiment of FIG. 9 addresses such issue by providing an ESD protection network with diodes and inductors to reduce current leakage and chip area cost.

Figure 9:
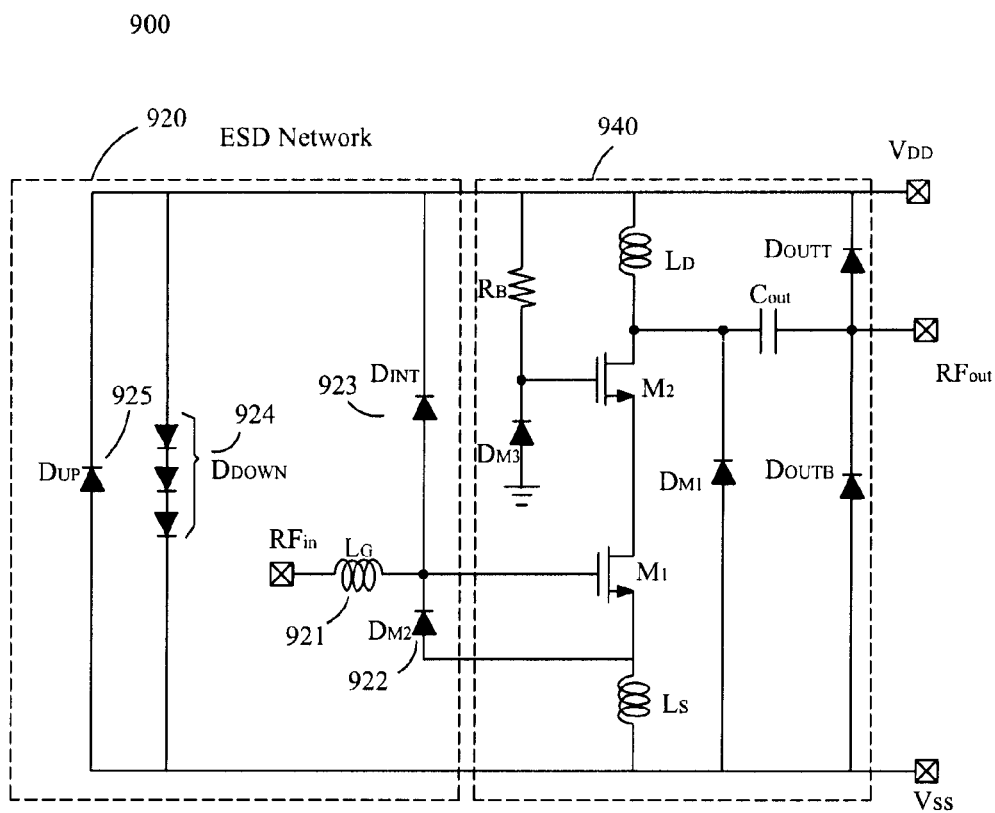
FIG. 9 is an illustration of an exemplary circuit adapted according to one embodiment.

FIG. 9 is an illustration of exemplary circuit 900 adapted according to one embodiment. Circuit 900 can be conceptually divided into two main components—ESD protection network 920 and RF front end circuitry 940 that includes a low noise amplifier and an impedance matching network. The present discussion will focus on ESD network 920 rather than describe RF front end circuitry 940. It is understood that the scope of embodiments is not limited to applications that include any particular types of protected circuitry, as some other embodiments are adapted to provide ESD protection to any of a variety of RF and millimeter wave devices. In FIG. 9, the following abbreviations appear as subscripts to the components: B=bias, INT=input top; D=drain; S=source; GS=gate-source; M=matching.

ESD network 920 includes an RF input (RFin), which communicates with RF front end circuitry 940 through ESD network 920. Inductor 921 is placed between RFin and RF front end circuitry 940. Diode 923 is coupled to Vdd and coupled to RFin through inductor 921. Diode 922 is coupled to RFin through inductor 921 and coupled to Vss through inductor Ls. ESD protection network 920 also includes diode 925 and diode string 924. Diode string 924 is shown with three diodes in this embodiment, and it is understood that in other embodiments diode string 924 may include one, two, or more diodes. Any of the diodes described in this embodiment may be implemented as a string of two or more diodes, though only one diode string is shown in FIG. 9. In some examples, a string of diodes is chosen over a single diode to provide a voltage drop for a large operation voltage.

Furthermore, it should be noted that diode 922 is shown as part of ESD network 920 but not as part of RF front end circuitry 940. Nevertheless, in the case of diode 922 the distinction is somewhat artificial, as diode 922 serves as part of the matching network as well by providing capacitance to the matching impedance.

In normal operation, diodes 921-925 are reversed biased and act as capacitors. The extra capacitance can provide noise decoupling and a perfect AC ground. In many applications the capacitance provided by diodes 922-925 takes the place of a large bypass capacitor. During an ESD event, diodes 922-925 become forward biased and remove the ESD current.

Figure 10:
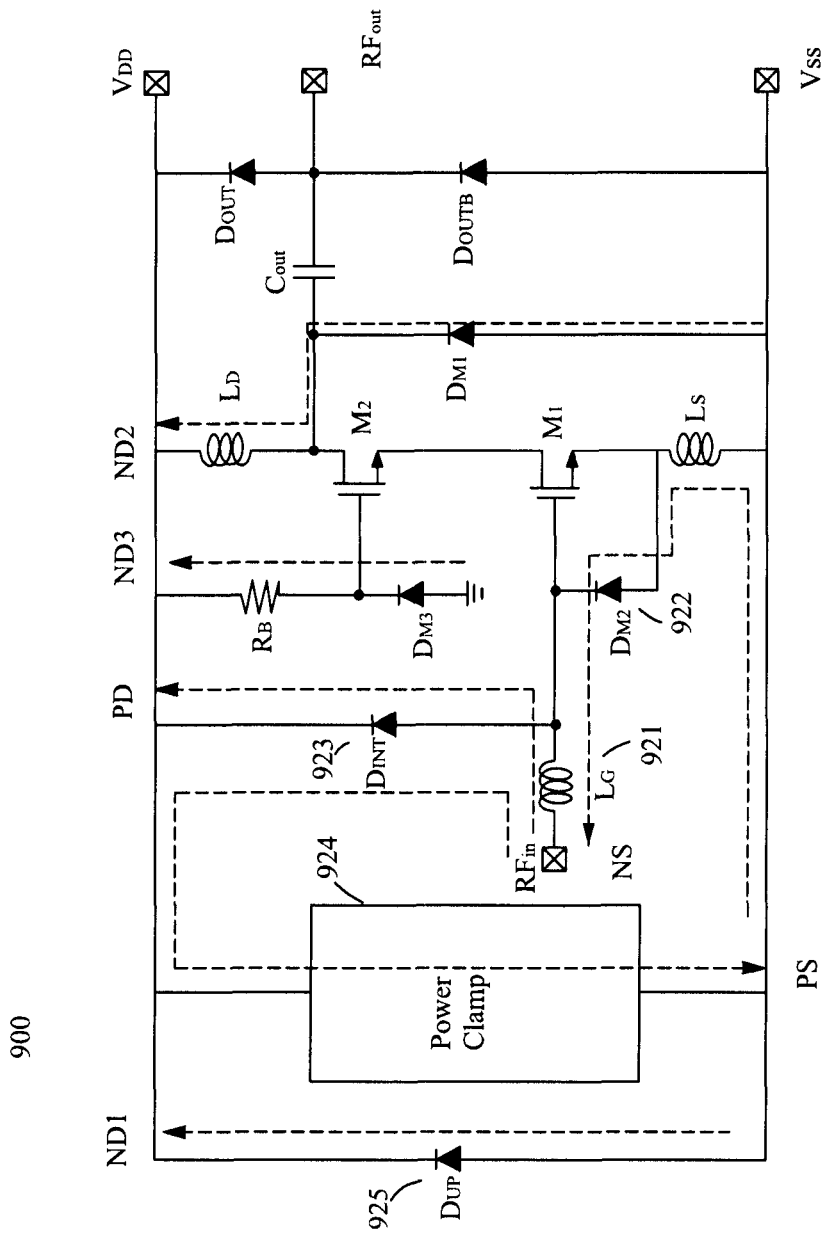
FIG. 10 is an illustration of the circuit of FIG. 9 showing the current paths during an ESD event when ESD diodes are forward biased.

FIG. 10 is an illustration of circuit 900 showing the current paths during an ESD event when diodes 922-925 are forward biased. The following abbreviations apply to the current paths: PS=positive ESD pulse, Vss grounded; PD=positive pulse, Vdd grounded; NS=negative ESD pulse, Vss grounded; ND=negative ESD pulse, Vdd grounded. Diode string 924 is shown as a power clamp in FIG. 10 because it provides a voltage drop that clamps the ESD pulse. Diode 925 can also be considered a power clamp in some embodiments because it provides a clamping voltage drop as well.

Furthermore, in this embodiment, the width of the metal of inductor 921 is at least five microns in order to handle current NS. Other embodiments may use different configurations for inductor 921 so long as those configurations are capable of safely and reliably conducting current NS. The inductance value depends on the particular RF design of circuit 900.

Also, the sizes of the individual diodes 922-925 is flexible from application to application and can be based on a number of circuit characteristics. Examples of circuit characteristic that influence the sizes of diodes 922-925 include the capacitance requirements of the circuit as a whole, desired voltage drop, and impedance provided by a matching network.

Figure 11:
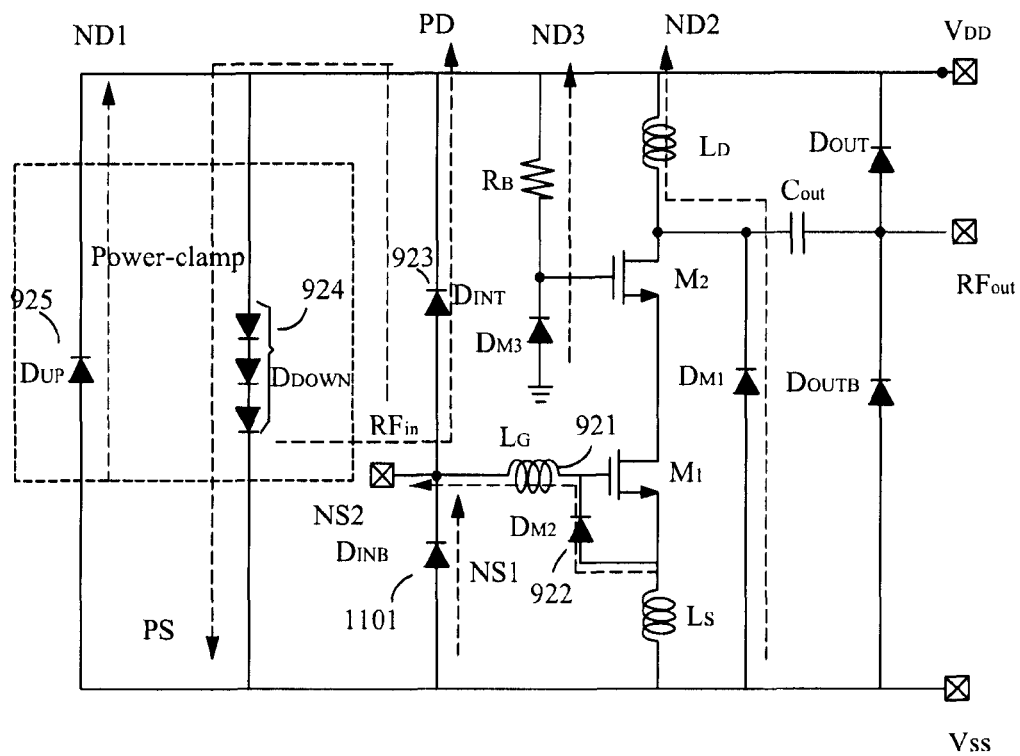
FIG. 11 shows an alternate embodiment circuit with a different architecture than the embodiment shown in FIGS. 9 and 10.

FIG. 11 shows an alternate embodiment circuit 1100 with a slightly different architecture than the embodiment shown in FIGS. 9 and 10. Circuit 1100 adds diode 1101 and moves diode 923 to connect to a node between RFin and inductor 921. FIG. 11 shows the resulting current paths during an ESD event. Once again, diodes 924 and 925 clamp the ESD pulse by applying a voltage drop thereto. The addition of diode 1101 provides for a more robust ESD protection network, especially for ND pulses, than that shown in FIGS. 9 and 10. Specifically, the addition of diode 1101 provides an extra current path for ESD pulses. Some applications can be adapted for use with either circuit 900 or circuit 1100.

Figure 12:
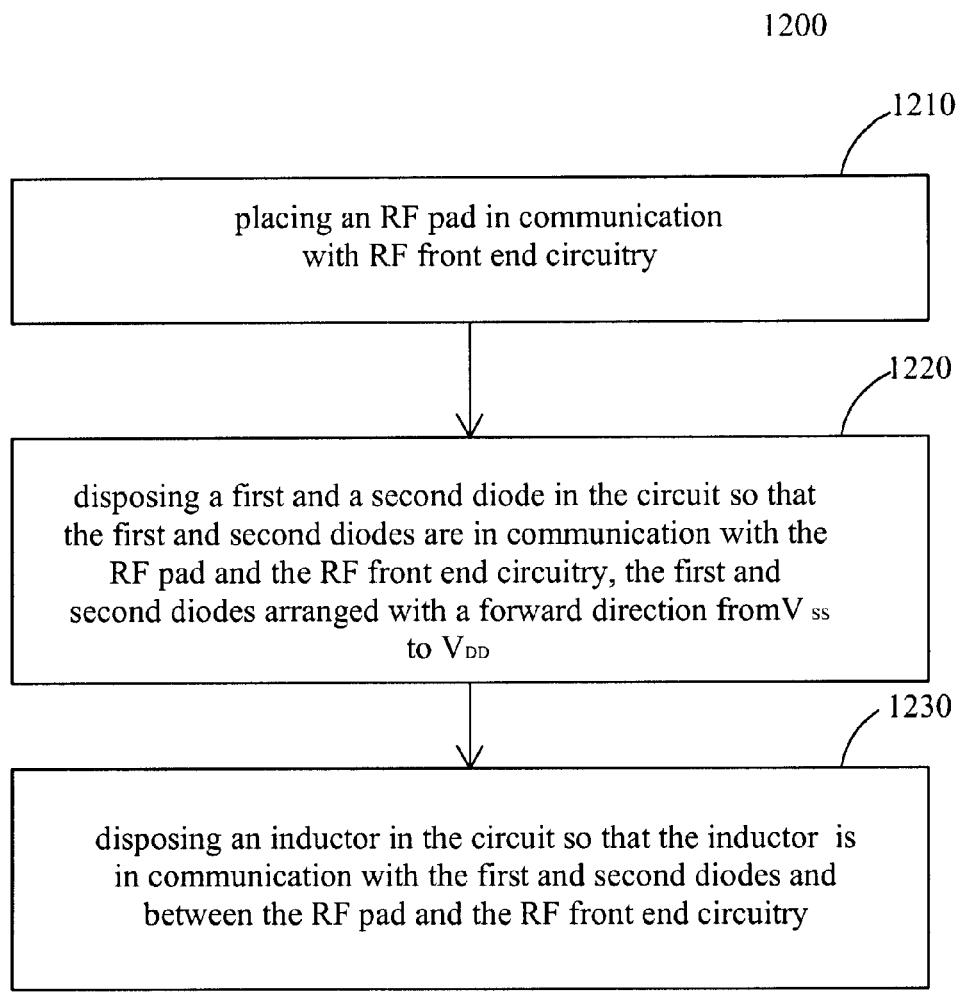
FIG. 12 is an illustration of an exemplary method adapted according to one embodiment for fabricating a circuit.

FIG. 12 is an illustration of exemplary method 1200 adapted according to one embodiment for fabricating a circuit. The method 1200 begins with block 1210 in which an RF pad is placed in communication with RF front end circuitry. In one example, block 1210 includes placing the RF pad and the RF front end circuitry on a circuit board. In another example, block 1210 includes routing a connection from the RF pad to RF front end circuitry within a package of dies. Various embodiments may use any techniques now known or later developed to fabricate devices and to connect the devices to make a working product.

Method 1200 continues with block 1220, which includes disposing a first and a second diode in the circuit. The first and second diodes are configured to be in communication with the RF pad and the RF front end circuitry, and they are placed so that their forward direction is from Vss to Vdd. While block 1220 refers to Vss and Vdd, it is understood that such terms are not meant to limit the scope of embodiments to NMOS devices only. On the contrary, block 1220 encompasses any power and complementary power arrangement, such as V+/V− and power/ground as examples.

In block 1230, an inductor is disposed in the circuit in communication with the first and second diodes and between the RF pad and the RF front end circuitry. A first example is shown in FIG. 9, and a second example is shown in FIG. 11, where inductor 921 can be placed either closer to the RF pad or closer to the RF front end circuitry. The first and second diodes are placed so that they are reverse biased during normal operation and forward biased in the event of an ESD pulse.

Embodiments are not limited to the specific example shown in FIG. 12. Other embodiments may add, omit, rearrange, or modify one or more actions. In one example, another diode is added between the RF pad and Vss, as shown in FIG. 11. In another example, other diodes and/or diode strings are placed between Vss and Vdd to provide additional ESD current paths and to provide voltage drops for clamping. Furthermore, any of the diodes in the example of method 1200 may be implemented as single diodes or as diode strings, as appropriate for a given application.

Some embodiments include one or more advantages. For instance, some embodiments avoid the use of a large bypass capacitor by the use of reverse-biased diodes that provide capacitance during normal operation. Such embodiments may experience a savings in device size and cost. Furthermore, some embodiments may avoid the use of a large, transistor-based power clamp by using diodes or diode strings as power clamps, thereby saving device size and cost.

The embodiments described above work well in many applications. However, some applications involving high data rate wireless communication of 15 GHz or more may experience undesirably high parasitic capacitance if used with some diode-based ESD protection devices. Accordingly various embodiments herein provide an inductor-based ESD protection device that can be used as an alternative to some diode-based ESD protection devices and can also be integrated with an impedance matching circuit.

Figure 13:
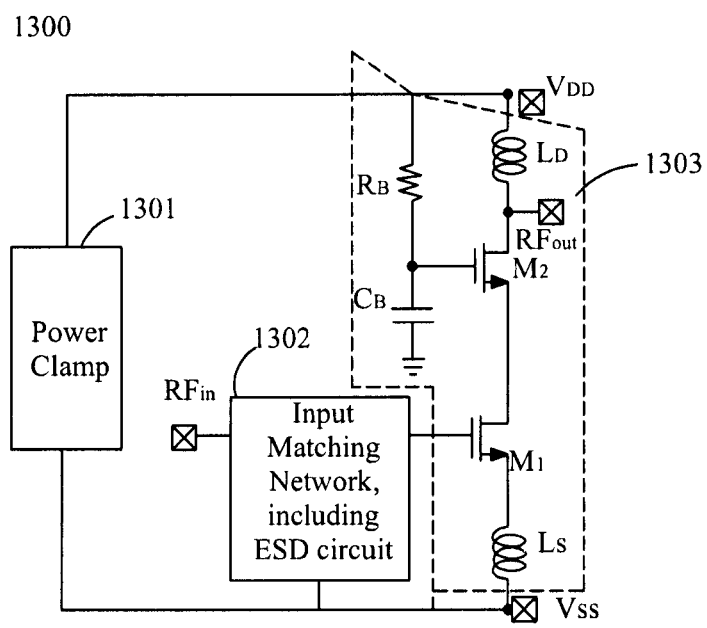
FIG. 13 is an illustration of an exemplary circuit, adapted according to one embodiment.

FIG. 13 is an illustration of exemplary circuit 1300, adapted according to one embodiment. Circuit 1300 includes protected circuit 1303, which is shown herein as a low noise amplifier as one example. In other embodiments, a protected circuit can be any type of circuit that might benefit from ESD protection. Circuit 1300 also includes input matching network 1302, which has an ESD protection circuit, and power clamp 1301. As in previously-described examples, the ESD protection circuit directs an ESD current to power clamp 1301, and power clamp 1301 mitigates the ESD current. The following figures provide more detail for several embodiments of matching network 1302.

Figure 14:
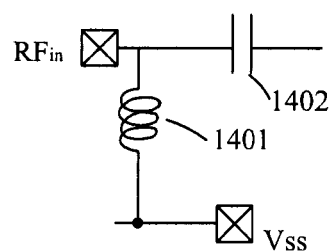
FIG. 14 is an illustration of an exemplary matching circuit, adapted according to one embodiment.

FIG. 14 is an illustration of exemplary matching circuit 1400, adapted according to one embodiment. Circuit 1400 can be used as input matching network 1302 in FIG. 13, by coupling lump inductor 1401 to Vss and coupling capacitor 1402 to protected circuit 1303 at M1. Matching network 1302 is designed to provide an appropriate input impedance, which is achieved by selection of inductor 1401 and capacitor 1402. In the present example, inductor 1401 is placed between the RF input (RFin) and Vss, thereby creating a path for ESD currents.

Some embodiments may use a bi-directional transmission line ESD inductor (not shown) coupling an RF input to Vss before a matching network. Such embodiments use the transmission line ESD inductor as an open stub during normal operation. However, the transmission line ESD inductor is ¼ wavelength or longer in order to act as an open stub, which is relatively large even at high frequencies. By contrast, other embodiments such as that shown in FIG. 14 incorporate ESD protection into the matching network and use a matching inductor for ESD protection. Inductor 1401 does not typically provide an open stub at normal operating frequencies, but inductor 1401 does provide an ESD current path during ESD events while providing impedance matching during normal operation. An advantage of the embodiment shown in FIG. 14 is that inductor 1401 may be made shorter than ¼ wavelength of the input signal when inductor 1401 is embodied as a transmission line inductor (e.g., a meander inductor, a spiral inductor, or the like). The size of inductor 1401 can be different from application to application, being influenced primarily by the specific characteristics of the matching impedance. The amount of voltage overshoot that can be handled by a given ESD protection device in this embodiment is chiefly influenced by the width of the metal of the inductor.

It is understood that the protected circuit may have a normal operating frequency range rather than a single, discrete operating frequency. Accordingly, references to the normal operating frequency or normal operating wavelength of the protected circuit include such ranges.

Similar inductor-based ESD protection circuits are not limited to the example shown in FIG. 14. Other embodiments may include different configurations, as shown in the next several figures.

Figure 15:
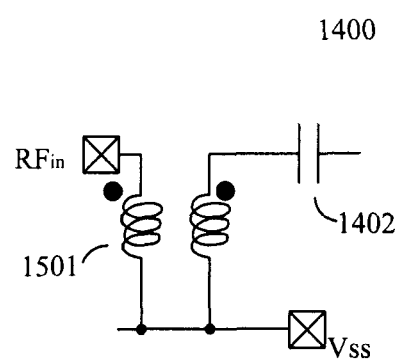
FIG. 15 is an illustration of an exemplary matching circuit, adapted according to one embodiment.

For instance, FIG. 15 is an illustration of exemplary matching circuit 1500, adapted according to one embodiment. Circuit 1500 includes inductor-based ESD protection using transformer 1501. Similar to the example above in FIG. 14, circuit 1500 uses transformer 1501 for impedance matching, and transformer 1501 is coupled to Vss thereby providing an ESD bypass current path.

The embodiment of FIG. 14 can be modified in other ways as well. FIGS. 16-19 provide four other examples of circuits that can be used as circuit 1302 (FIG. 13), and it is understood that the number of different possible designs is not limited to those specifically shown herein. Selection of a design may take into consideration factors such as the specific input impedance that should be achieved for a given application. Each of the designs shown in FIGS. 16-19 can be used to provide a different input impedance.

Figure 16:
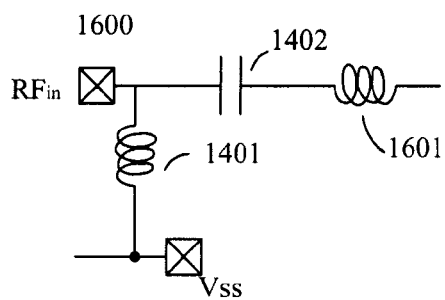
FIG. 16 is an illustration of an exemplary matching circuit, adapted according to one embodiment.

FIG. 16 is an illustration of exemplary matching circuit 1600, adapted according to one embodiment. When compared with the embodiment of FIG. 14, circuit 1600 adds inductor 1601 in series with capacitor 1402 between capacitor 1402 and the protected circuit (not shown).

Figure 17:
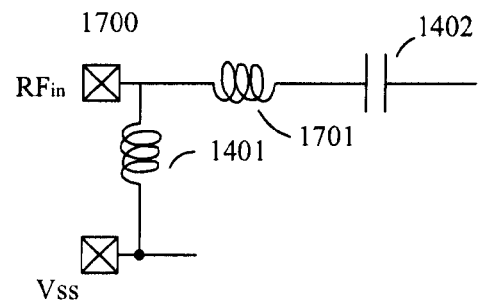
FIG. 17 is an illustration of an exemplary matching circuit, adapted according to one embodiment.

FIG. 17 is an illustration of exemplary matching circuit 1700, adapted according to one embodiment. Circuit 1700 adds inductor 1701 in series with capacitor 1402 between capacitor 1402 and RFin.

Figure 18:
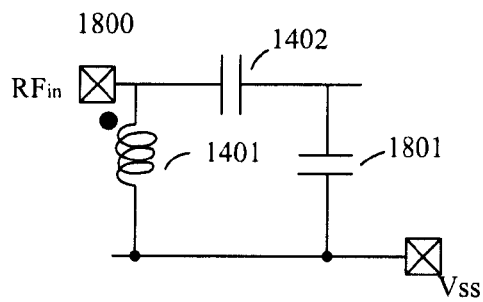
FIG. 18 is an illustration of an exemplary matching circuit, adapted according to one embodiment.

FIG. 18 is an illustration of exemplary matching circuit 1800, adapted according to one embodiment. Circuit 1800 adds capacitor 1801 between the signal line and Vss after capacitor 1402. Inductor 1401 and capacitor 1801 are coupled to opposite terminals of capacitor 1402.

Figure 19:
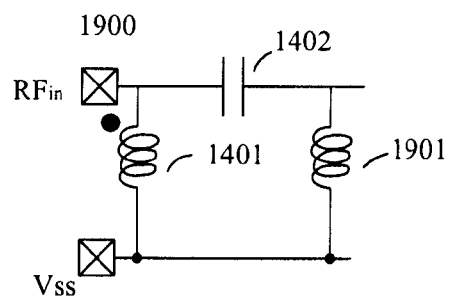
FIG. 19 is an illustration of an exemplary matching circuit, adapted according to one embodiment.

FIG. 19 is an illustration of exemplary matching circuit 1900, adapted according to one embodiment. Circuit 1900 adds inductor 1901 between the signal line and Vss after capacitor 1402. Inductor 1401 and inductor 1901 are coupled to opposite terminals of capacitor 1402.

Figures 20, 21:
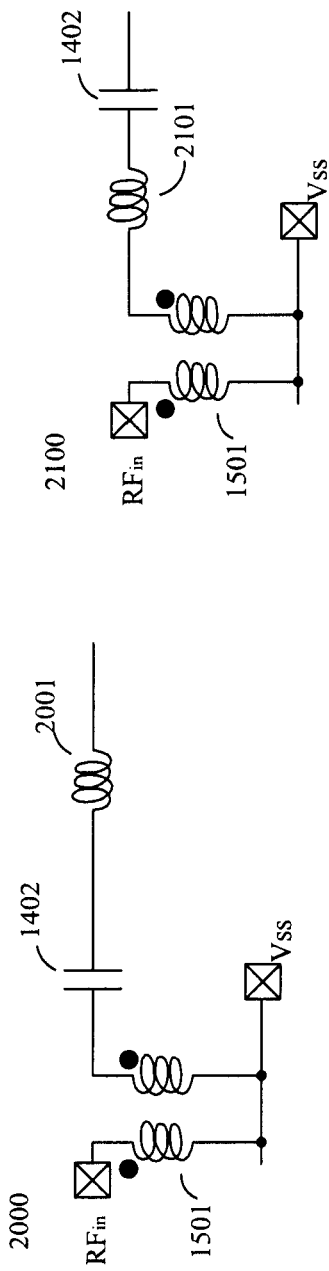
FIGS. 20 and 21 provide variations on the embodiment shown in FIG. 15, where a transformer is used for impedance matching and ESD current bypass.

FIGS. 20 and 21 provide variations on the embodiment shown in FIG. 15, where a transformer is used for impedance matching and ESD current bypass. Specifically, FIG. 20 adds inductor 2001 in series with capacitor 1402 between capacitor 1402 and the protected circuit (not shown). FIG. 21 adds inductor 2101 in series with capacitor 1402 between capacitor 1402 and transformer 1501.

Figure 22:
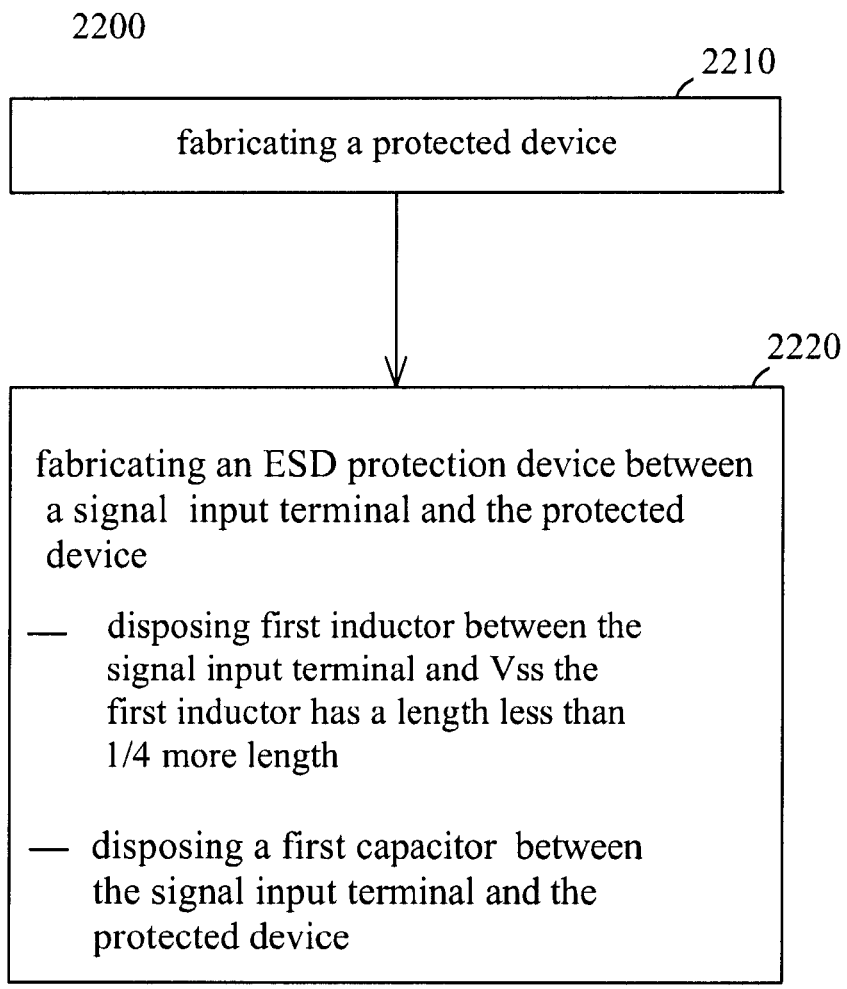
FIG. 22 is an illustration of an exemplary method for fabricating a device according to one embodiment.

FIG. 22 is an illustration of exemplary method 2200 for fabricating a device according to one embodiment. In block 2210, a protected device is fabricated. In some embodiments the protected device is fabricated on a circuit board or as a stand-alone device. In other embodiments, the protected device is fabricated on a semiconductor chip and is connected to other components within the semiconductor chip and/or outside of the semiconductor chip. The protected device can include any electronic device, though a specific example includes RF front end circuitry.

In block 2220, an ESD protection device is fabricated between a signal input terminal and the protected device. Fabricating the ESD protection device may include, e.g., disposing a first inductor between the signal input terminal and Vss. The first inductor has a length less than ¼ wavelength.

Fabricating the ESD protection device may also include disposing a first capacitor between the signal input terminal and the protected device. In this embodiment, the ESD protection device is part of the core design of the circuit and is included in the matching network.

The scope of embodiments is not limited to the specific example of method 2200. For instance, other embodiments may include adding or rearranging components, as shown in FIGS. 15-21.

Various embodiments may provide advantages over other techniques. For instance, compared to some diode-based ESD protection schemes that use a large bypass capacitor, the embodiments of FIGS. 13-22 have the advantages of bi-directional operation, a lower on-resistance state, and a lower voltage drop during an ESD event.

Compared to embodiments using Silicon Controlled Rectifiers (SCRs), the embodiments of FIGS. 13-22 have the advantages of lower parasitic capacitance, higher ESD turn-on speed, and much easier RF modeling properties. Compared to embodiments using a transmission line inductor as an open stub, the embodiments of FIGS. 13-22 have the advantages of a smaller area size, lower loss, and flexible practical design and layout routing because the embodiments of FIGS. 13-22 can use smaller inductors.

It is understood for each of the embodiments shown above, additional processes may be performed to complete the fabrication of the ESD protection device. For example, these additional processes may include deposition of passivation layers, formation of contacts, and formation of interconnect structures (e.g., lines and vias, metal layers, and interlayer dielectric that provide electrical interconnection to the device). Other additional processes may include, e.g., PCB fabrication processes and semiconductor die packaging processes. For the sake of simplicity, these additional processes are not described herein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, embodiments shown as NMOS devices can be extended to PMOS devices with a similar structure and configuration except that all doping types may be reversed and dimensions are modified according to PMOS design. Further, the PMOS device may be disposed in a deep n-well pocket for isolating the device.

What is claimed is:

1. A circuit comprising:
   an electrostatic discharge (ESD) protection device; and
   a protected circuit in communication with the ESD protection device, the protected circuit processing a signal having a wavelength;
   wherein the ESD protection device comprises:
      a first inductor between a signal input terminal and a complementary power line, the first inductor having a length less than ¼ of the wavelength of the signal;
      a second inductor between the protected circuit and the complementary power line, the second inductor forming a transformer with the first inductor; and
      a first capacitor between the second inductor and the protected circuit, wherein the transformer and the first capacitor provide matching impedance for the protected circuit, and wherein there is no diode between the signal input terminal and the protected circuit.

2. The circuit of claim 1 in which the protected circuit comprises a Low Noise Amplifier (LNA).

3. The circuit of claim 2 in which the ESD protection device is included in a core design of a matching network for the protected circuit.

4. The circuit of claim 1 in which the first inductor comprises a transmission line.

5. The circuit of claim 1 in which the first inductor comprises a spiral inductor.

6. The circuit of claim 1 in which the ESD protection device further comprises a second capacitor coupled to the complementary power line, and further in which the second capacitor and the first inductor are coupled to opposite terminals of the first capacitor.

7. The circuit of claim 1 in which the ESD protection device further comprises a second inductor in series with the first capacitor.

8. The circuit of claim 1 in which the ESD protection device further comprises a second inductor coupled to the complementary power line, and further in which the first and second inductors are coupled to opposite terminals of the first capacitor.

9. The circuit of claim 1 further comprising a power clamp coupled to the ESD protection circuit.

10. The circuit of claim 1 in which the signal is selected from the list consisting of:
    RF signals; and
    millimeter wave signals.

11. A circuit comprising:
    an electrostatic discharge (ESD) protection device positioned between a protected circuit and a signal input terminal, the signal input terminal receiving a signal with a wavelength, the ESD protection device including:
        a first inductor having a length less than ¼ of the wavelength, the first inductor providing an ESD current path from the signal input terminal to the complementary power line;
        a second inductor between the protected circuit and the complementary power line, the second inductor forming a transformer with the first inductor; and
        a first capacitor between the second inductor and the protected circuit, wherein the ESD protection circuit is part of an impedance matching network for the protected circuit, and wherein there is no diode between the signal input terminal and the protected circuit.

12. The circuit of claim 11, in which the signal input terminal comprises at least one of a Radio Frequency (RF) pad and a millimeter wave input pad.

13. The circuit of claim 11 in which the protected circuit has an operating frequency greater than 15 GHz.

14. The circuit of claim 11 in which the first inductor includes an item selected from the list consisting of:
    a spiral inductor; and
    a transmission line inductor.

15. The circuit of claim 11 further comprising at least one of the following:
    a second capacitor coupled to the complementary power line, in which the second capacitor and the first inductor are coupled to opposite terminals of the first capacitor;
    a second inductor in series with the first capacitor; and
    a second inductor coupled to the complementary power line, in which the first and second inductors are coupled to opposite terminals of the first capacitor.

16. A method of fabricating a device, the method comprising:
    fabricating a protected device between a power line and a complementary power line; and
    fabricating an electrostatic discharge (ESD) protection device between a signal input terminal and the protected device, in which fabricating the ESD protection device comprises:
        disposing a first inductor between the signal input terminal and the complementary power line, in which the first inductor has a length less than ¼ of a normal operating wavelength of protected device;
        disposing a second inductor between the protected circuit and the complementary power line, the second inductor forming a transformer with the first inductor; and
        disposing a first capacitor between the second inductor and the protected device, wherein there is no diode between the signal input terminal and the protected circuit.

17. The method of claim 16 further comprising at least one of the following actions:
    coupling a second capacitor to the complementary power line, in which the second capacitor and the first inductor are coupled to opposite terminals of the first capacitor;
    disposing a second inductor in series with the first capacitor; and
    coupling a second inductor to complementary power line, in which the first and second inductors are coupled to opposite terminals of the first capacitor.

18. The method of claim 16, in which the ESD protection device is disposed within a matching network for the protected device.

* * * * *